United States Patent
Zhao et al.

(10) Patent No.: US 9,203,426 B2
(45) Date of Patent: Dec. 1, 2015

(54) ESTIMATION OF DIGITAL-TO-ANALOG CONVERTER STATIC MISMATCH ERRORS

(71) Applicant: ANALOG DEVICES TECHNOLOGY, Hamilton (BM)

(72) Inventors: Jialin Zhao, Needham, MA (US); Richard E. Schreier, Toronto (CA); Jose Barreiro Silva, Burlington, MA (US); Hajime Shibata, Toronto (CA); Wenhua W. Yang, North Andover, MA (US); Yunzhi Dong, Toronto (CA)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/302,173

(22) Filed: Jun. 11, 2014

(65) Prior Publication Data
US 2015/0288380 A1    Oct. 8, 2015

Related U.S. Application Data

(60) Provisional application No. 61/976,224, filed on Apr. 7, 2014.

(51) Int. Cl.
*H03M 1/10* (2006.01)
*H03M 3/00* (2006.01)

(52) U.S. Cl.
CPC ............ *H03M 3/378* (2013.01); *H03M 1/1019* (2013.01); *H03M 3/37* (2013.01); *H03M 3/384* (2013.01); *H03M 3/464* (2013.01)

(58) Field of Classification Search
None
See application file for complete search history.

(56) References Cited

U.S. PATENT DOCUMENTS

| | | | |
|---|---|---|---|
| 4,399,426 A * | 8/1983 | Tan ................................ | 341/120 |
| 4,835,535 A | 5/1989 | Shibayama et al. | |
| 6,486,807 B2 * | 11/2002 | Jonsson ........................ | 341/120 |
| 7,362,247 B2 * | 4/2008 | Arias et al. .................... | 341/120 |
| 9,007,242 B2 * | 4/2015 | Lin ................................ | 341/120 |
| 2009/0085785 A1 | 4/2009 | Gerfers et al. | |
| 2014/0070969 A1 * | 3/2014 | Shu ................................ | 341/118 |

OTHER PUBLICATIONS

Mohammad Sarhang-Nejad et al., "A High-Resolution Multibit ΣΔ ADC with Digital Correction and Relaxed Amplifier Requirements", IEEE Journal of Solid-State Circuits, vol. 28, No. 6, Jun. 1993, 0018-9200/93$03.00 © 1993 IEEE, 13 pages.
Nagendra Krishnapura, "Efficient Determination of Feedback DAC Errors for Digital Correction in ΔΣ A/D Converters", 978-1-4244-5309-2/10/$26.00 © 2010 IEEE, 4 pages.
Extended European Search Report issued for EP Patent Application Serial No. 15159281.3 mailed Aug. 6, 2015, 9 pages.

* cited by examiner

*Primary Examiner* — Howard Williams
(74) *Attorney, Agent, or Firm* — Patent Capital Group

(57) ABSTRACT

Digital-to-analog converters (DACs) are used widely in electronics. The DACs are usually not ideal and typically exhibits errors, e.g., static mismatch errors. This disclosure describes a digital calibration technique for DAC static mismatch in continuous-time delta-sigma modulators (CTDSMs). The methodology utilizes the DAC unit elements (UEs) themselves to measure each other's mismatch. There are no extra circuitries except for the logic design inside DAC drivers or comparators. The methodology is an attractive calibration technique for high performance CTDSMs, especially for high speed system in multi-gigahertz range with low over-sampling rate (OSR).

25 Claims, 12 Drawing Sheets

ESTIMATION OF DIGITAL-TO-ANALOG CONVERTER STATIC MISMATCH ERRORS

CROSS-REFERENCE TO RELATED APPLICATION

This non-provisional patent application receives benefit from or claims priority to, under 35 U.S.C. §119(e), U.S. Provisional Patent Application Ser. No. 61/976,224, filed Apr. 7, 2014 and entitled "ESTIMATION OF DIGITAL-TO-ANALOG CONVERTER STATIC MISMATCH ERRORS", which is hereby incorporated by reference in its entirety.

TECHNICAL FIELD OF THE DISCLOSURE

The present disclosure relates generally to data converters and, more particularly, to the estimation of digital-to-analog converter static mismatch errors.

BACKGROUND

Data converters are ubiquitous in electronics. Some data converters, e.g., analog-to-digital converters (ADCs) and digital-to-analog converters (DACs), allow us to convert signals between the digital domain and the analog domain. Data converters of various flavors are used in a myriad of applications, e.g., high-speed applications, precision applications, mission-critical systems, consumer electronics, entertainment, media systems, telecommunications, medical devices, and so on. Depending on the application, data converters can be designed or selected to suit every specification: accuracy, resolution, sample rate, bandwidth, power, size, and value.

OVERVIEW

Digital-to-analog converters (DACs) are used widely in electronics. The DACs are usually not ideal and typically exhibits errors, e.g., static mismatch errors. This disclosure describes a digital calibration technique for DAC static mismatch in continuous-time delta-sigma modulators (CTDSMs). The methodology utilizes the DAC unit elements (UEs) themselves to measure each other's mismatch. There are no extra circuitries except for the logic design inside DAC drivers. The methodology is an attractive calibration technique for high performance CTDSMs, especially for high speed system in multi-gigahertz range with low over-sampling rate (OSR).

DESCRIPTION OF EXAMPLE EMBODIMENTS OF THE DISCLOSURE

Basics of Analog-to-Digital Converters

Figure 1:
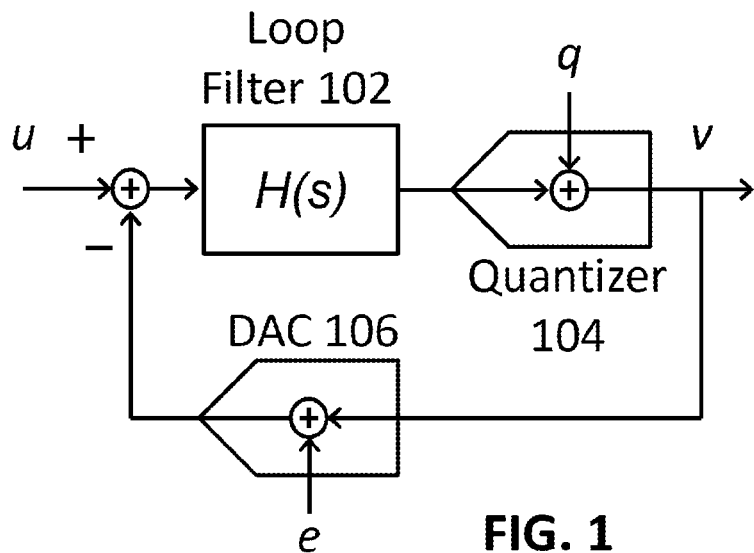
FIG. 1 is a system diagram of an illustrative delta-sigma modulator.

In many electronics applications, an analog-to-digital converter (ADC) converts an analog input signal to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). Analog-to-digital converters (ADCs) have many different designs, which can be chosen based on the application requirements.

ADCs are devices that convert a continuous physical quantity carried by an analog signal to a digital number that represents the quantity's amplitude (or a digital signal carrying that digital number). The conversion would typically involve quantization of the analog input signal, so the quantization process would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

Analog-to-Digital Converters Having Feedback/Feedforward Digital-to-Analog Converters ADCs can have a variety of architectures. For some ADCs, the architecture for outputting a digital signal may actually also include digital-to-analog converters (DACs), e.g., in the feedback and/or feedforward path(s), to improve the quality of the digital output signal. Examples of such ADCs having DACs therein include delta-sigma ADCs, multi-stage noise shaping (MASH) ADCs, successive approximation register (SAR) ADCs, and pipeline ADCs. In many of these applications, the accuracy and performance of the DACs in these ADCs is very important to the overall accuracy and performance of the ADCs.

For some applications where power efficiency, speed, and performance is critical, system designers have often opted to use a delta-sigma analog-to-digital converter (DS ADC) to meet the requirements of the application. In particular, system designers may choose to use a continuous time delta-sigma analog to digital converter, also referred to as a continuous time delta-sigma modulator (CTDSM). ADCs based on delta-sigma (DS) modulation (referred to herein as "DS ADCs") have been widely used in digital audio and high precision instrumentation systems.

FIG. 1 is a system diagram of an illustrative (continuous-time) delta-sigma modulator (DSM). Continuous-time delta-sigma modulators (CTDSM) has been gaining attention in the design community for their advantages over the discrete-time implementation of the delta-sigma modulators. The CTDSM includes loop filter 102, quantizer 104, and feedback digital-to-analog converter (DAC) 106. The CTDSM usually provides the advantage of being able to convert an analog input signal to a digital signal with high resolution at low cost, high performance, and high power efficiency. Typically, a CTDSM encodes an analog signal u using a quantizer 104, employing, e.g., a low resolution ADC, as a 1-bit ADC, Flash ADC, Flash quantizer, etc. Then, if applicable, the CTDSM can apply a digital filter (not shown) to the output of the Quantizer 104 to form a higher-resolution digital output. Loop filter 102 (also implemented in continuous-time) may be provided to provide error feedback for the CTDSM, wherein the error is generated by taking the difference between the original analog input signal u and a reconstructed version of the original analog input signal generated using the feedback DAC 106 (where digitized signal is converted back into an analog signal). One key characteristic of a delta-sigma modulator is its ability to push the quantization noise q (from quantizer 104) to higher frequencies, also referred to as noise shaping (an effect provided by the loop filter 102). As a result, CTDSMs are generally able to achieve high resolution analog-to-digital conversion.

Errors in Feedback Digital-to-Analog Converters in Continuous-Time Delta-Sigma Modulators As shown in FIG. 1, in a CTDSM, the analog input u is converted to a sequence of digital code v that approximate the spectrum of the input closely in a narrow band, while the quantization error q is shaped away. Comparing to its single bit counterpart, multi-bit CTDSM can achieve better Signal-to-Quantization-Noise Ratio (SQNR) because of smaller quantization step and feasibility of higher out of band gain. Unfortunately the usage of multi-bit quantizer also requires a multi-bit DAC in the feedback path. The feedback digital-to-analog converter (e.g., DAC 106 of FIG. 1) are, in some cases, not ideal. Although the delta-sigma modulator, in particular, the loop filter 102, is able to shape the noise from the quantizer 104, the delta-sigma modulator does not correct for nor shape the error e from the feedback DAC 106. As a result, the error e from DAC 106 shows up at the output v. In other words, the DAC nonlinearities add directly to the input signal and are not noise-shaped. Therefore the DAC nonlinearity needs to be as good as the modulator itself.

Errors in Feedback Digital-to-Analog Converters in Continuous-Time Delta-Sigma Modulators Used in Multi-Stage Noise Shaping Analog-to-Digital Converters The CTDSM of FIG. 1 or variations thereof have been used to as part of a larger DS ADCs. For applications with an emphasis on noise shaping, a higher order DS modulator may be used, i.e., more integrators and feedback paths are used in the loop filter for shaping the quantization noise further out to even higher frequencies. One group of structures have been proposed for DS ADCs—multi-stage noise shaping (MASH) ADCs—with some variations having a front-end and a back-end where inputs to each stage differ, and/or the implementation of the stage may differ. One advantage of MASH ADCs is its ability to use more stable lower order DS modulators in multiple stages to achieve the noise shaping performance of a higher order DS ADC. The feedback DAC errors described in the previous section remain an issue in MASH ADCs.

Generally speaking, MASH ADCs can include a plurality of stages for digitizing the signal and errors of the system in order to meet design requirements related to bandwidth, resolution, and the signal to noise ratios. One or more of these stages typically uses the original analog input signal as a reference signal to produce a residual signal (i.e., an error between a reconstructed version of the analog input signal) in order to reduce the amount of noise introduced by the ADC and/or to increase the resolution of the output.

From the analog input signal, the first stage generates a digital output. The input of the quantizer in the first stage can be subtracted from the first DAC output to yield the first stage quantization noise. The result is that the first stage generates an analog signal representing its quantization noise, and the second stage quantizes the quantization noise of the first stage. The multi-stage approach allows the quantization noise to be reduced and thus allows the MASH ADC to achieve higher performance. If more stages are used, the input of the quantizer in the second stage can be subtracted from the second DAC output to yield the second stage quantization noise which can be in turn quantized by a third stage. Effectively, the result is that the quantization noise of the first stage is suppressed by the second stage, and the quantization noise from the second stage is suppressed by the third stage.

Figure 2:
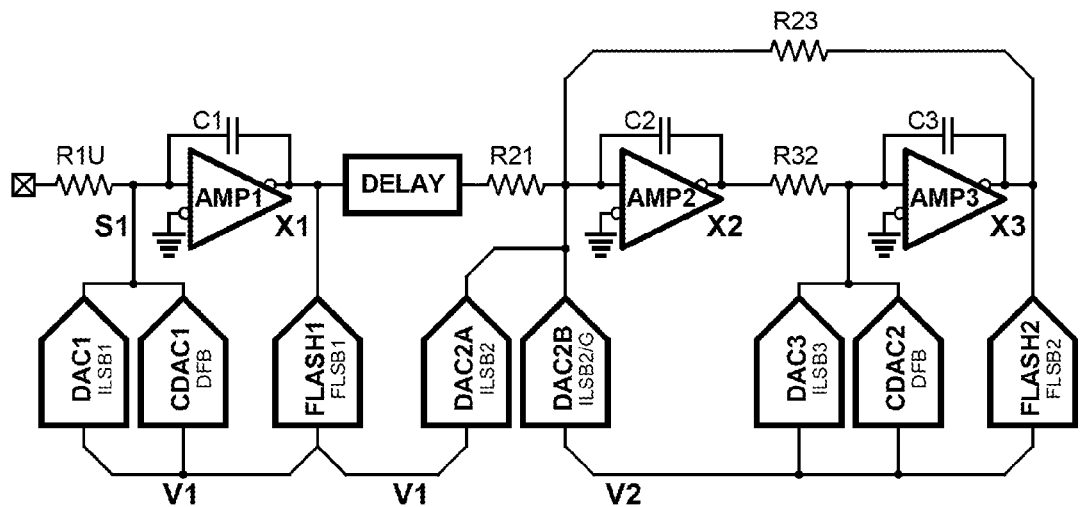
FIG. 2 is a system diagram of an exemplary continuous time delta-sigma multi-stage noise shaping analog-to-digital converter.

FIG. 2 is a system diagram of an exemplary multi-stage noise shaping (MASH) continuous time (CT) delta-sigma (DS) analog-to-digital converter (ADC). In this example, the diagram illustrates a 1-2 MASH CT DS ADC. The residue of the coarse quantization provided by the flash quantizer (FLASH1) inside the 1st order front end (i.e., the first stage) is fed to the 2nd order DS back end (i.e., the second stage) and gets digitized. The digital outputs V1 and V2 are then properly combined in digital domain as the final digital word.

While providing multiple stages increases complexity and cost, MASH ADCs can achieve remarkable performance. However, many of these MASH ADC structures still suffer from some shortcomings. While the MASH ADC is effective in shaping the quantization noise, the errors from the feedback DAC in each of these stages are still present at the output of each stage. To alleviate this issue, various ADCs may provide an error correction mechanism which aim to alleviate the non-linearities of the feedback DACs. In other words, one of the critical goals in the design of multi-bit delta-sigma ADCs is to reduce the impact that the limited linearity in the main feedback DAC has on the overall ADC performance (i.e., to correct or alleviate issues caused by the noise in the main feedback DAC). The mismatch errors from the main DAC are not shaped by the modulator, so the errors may need to be reduced by a linearization technique (e.g., by adding an estimated error in one or more parts of the signal chain to correct for the feedback DAC error). To correct the error via the linearization technique, the error must be estimated. The present disclosure describes an improved method to digitally measure the error of the feedback DACs.

Figure 3:
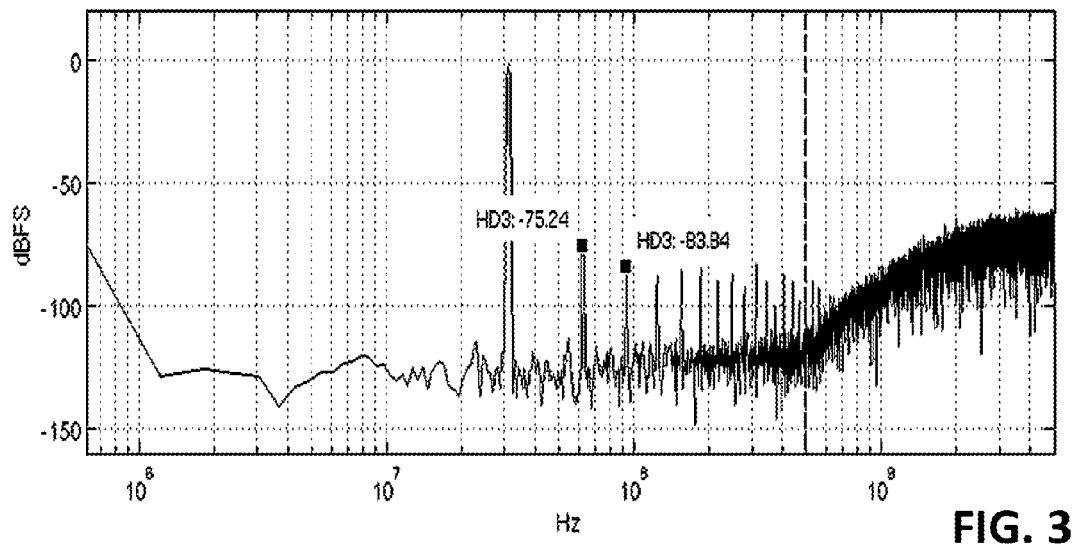
FIG. 3 is an illustrative power spectrum of the exemplary continuous time delta-sigma multi-stage noise shaping analog-to-digital converter as shown in FIG. 2.
Figure 4:
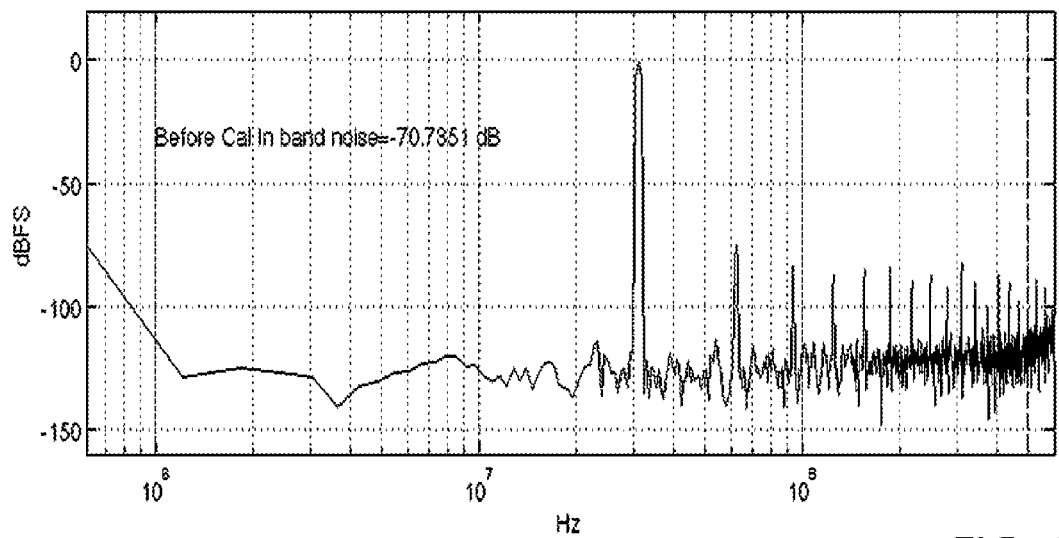
FIG. 4 is an illustrative integrated in band noise plot for the exemplary continuous time delta-sigma multi-stage noise shaping analog-to-digital converter as shown in FIG. 2.

To further illustrate the importance of correcting the error of the feedback DAC, FIGS. 3-4 show how an output signal of a MASH ADC is deteriorated due to the errors of the feedback DAC. FIG. 3 is an illustrative power spectrum (to half of the sampling frequency, or Fs/2) of the exemplary continuous time delta-sigma multi-stage noise shaping analog-to-digital converter as shown in FIG. 2, and FIG. 4 is an illustrative integrated in band noise plot (zoomed-in spectrum up to 600 MHz) for the exemplary continuous time delta-sigma multi-stage noise shaping analog-to-digital converter as shown in FIG. 2. In particular, these two plots illustrates the performance of a 1-2 MASH CT DS ADC (e.g., the ADC shown in FIG. 2) for a non-linear DAC in the front-end loop (DAC1). The nonlinearity is mainly from static error, which creates undesirable harmonic distortions in band as can be seen in the two plots. The Signal-to-Noise-and-Distortion Ratio (SNDR) and spurious free dynamic range (SFDR) performances of the modulator are greatly deteriorated. Therefore, for multi-bit CTDSM, the correction of the static mismatches among the DAC elements to achieve high linearity is one the most critical design issues.

Understanding Static Mismatch Errors

Figure 5:
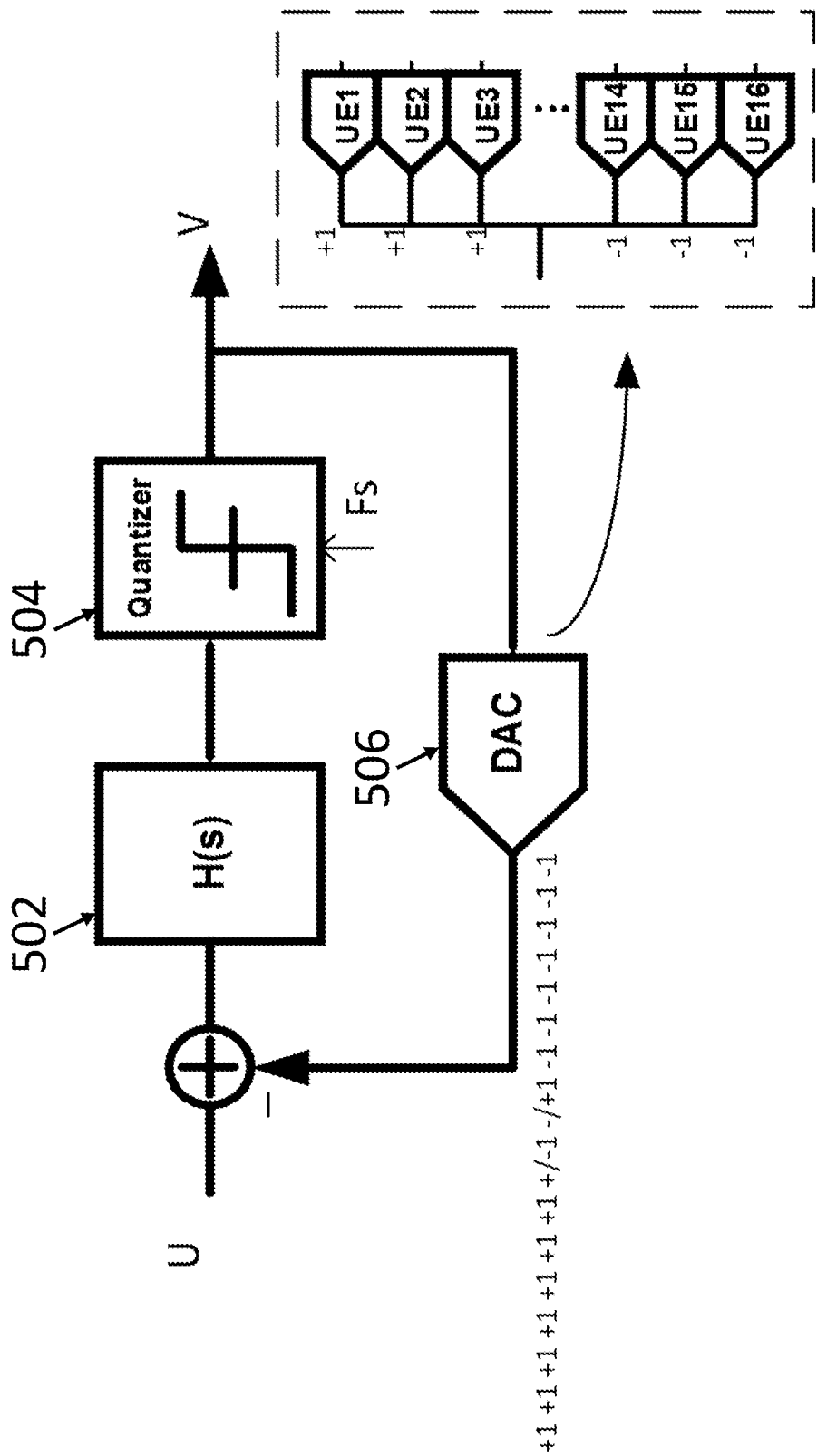
FIG. 5 is an illustrative block diagram showing unit elements in a digital-to-analog converter within a continuous-time delta-sigma modulator, according to some embodiments of the disclosure.

The present disclosure pays attention to static mismatch errors in the feedback DAC. The feedback DAC is typically in a feedback configuration with an analog-to-digital converter (ADC). That is, the output of the ADC is fed to the input of the feedback DAC, and the output of the feedback DAC is fed back to the input path of the ADC. Generally speaking, the feedback DAC 106 is implemented with a plurality of unit elements, e.g., current steering cells, where each of these cells help generate, from the input digital code v fed to the feedback DAC 106, one or more parts of analog signal. FIG. 5 is an illustrative block diagram showing unit elements in a digital-to-analog converter within a continuous-time delta-sigma modulator (CTDSM), according to some embodiments of the disclosure. Specifically, the illustration shows a multi-bit CTDSM, with loop filter H(s) 502, a clocked quantizer 504, and a multi-bit DAC 506 in the feedback loop. The multi-bit DAC 506 generally exhibit errors.

The quantizer output is thermometer coded, and the DAC is unit-element based, where all the unit elements (UE) may have the same weight. A 17-level mid-tread DAC, using 16 elements UE1, UE2, UE3, . . . UE15, and UE16, is depicted. Based on digital code, the complementary DAC element (i.e., the UE) provides a feedback current of either $+I_{LSB}$ or $-I_{LSB}$.

Within this disclosure, the DAC unit element (UE) is treated dimensionless, and its nominal value will be either +1 or −1. The full scale output range of the DAC is from −16 to +16 with LSB of +2. For example, in an ideal modulator with shorted input, UE1 to UE8 will be +1, and UE9 to UE16 will be −1, therefore the sum of all the DAC UEs are 0, which equals to the input. Outer UEs can be non-toggling UEs, and middle UEs can be toggling UEs.

These unit elements of the feedback DAC do not always match perfectly, i.e., the current output from these unit elements are not all exactly the same or perfect. Non-matching unit elements can cause undesirable non-linear behavior in the feedback DAC 106, and thus, for a high performance CTDSM, these static mismatch errors ought to be corrected. Otherwise, the static mismatch errors directly degrade the accuracy of the analog-to-digital converter system.

Overview of Digital Calibration of Feedback Digital-to-Analog Converters Errors

Calibration of the DAC errors can be performed in different ways. One way of calibration is to perform digital estimation of the feedback DAC static mismatch error. Digital calibration can take advantage of the speed improvement and area reduction from process shrink. The digital calibration technique described herein is based on the fundamental principle that the feedback loop forces the average of the output digital code V, equals to the input value U (referring to FIGS. 1 and 5). The difference between each two DAC elements is measured using the rest of the DAC elements, by either applying an external Direct Current (DC) offset, using DAC elements themselves as a DC offset, or using a shuffler. The critical idea is to be able to force DAC element to output its complementary value. Forcing one DAC element to output its complementary value is equivalent to providing twice of its DC offset value at the modulator input. During the calibration procedure, sequentially each element is forced to output complementary value, and the rest 15 elements are used to measure error of that element.

To summarize, this disclosure describes a digital calibration technique for digital-to-analog converter (DAC) static mismatch in continuous-time delta-sigma modulator (CTDSM). The methodology utilizes the DAC unit elements (UEs) themselves to measure each other's mismatch, without any additional DAC elements. The obtained errors can be stored in a look-up table and fully corrected in digital domain or analog domain. The technique is validated through MATLAB behavior simulation on a 1-2 continuous-time delta-sigma Multi-Stage Noise-Shaping (MASH) modulator. The simulations show that this technique can reduce the harmonic distortions (HD) caused by the static mismatch among DAC UEs by more than 20 dB. There are no extra circuitries except for simple logic design inside DAC drivers or comparators. This will be an attractive calibration technique for high performance CTDSM, especially for high speed system in multi-GHz range with low over-sampling rate (OSR).

Primary Methodology for Digital Calibration of Feedback Digital-to-Analog Converters Errors The calibration technique is based on the fact that the feedback loop (e.g., the feedback loop of the delta-sigma modulator) forces the average of the output digital code V to equal to the input value U (as seen in FIGS. 1 and 5). Consider the case when U=0, as previously mentioned, ideally UE1 to UE8 will be +1, and UE9 to UE16 will be −1. In real circuit implementation, the loop will have circuitry noise, offset and mismatches. The middle elements UE7 to UE10 will likely switch between +1 and −1, while UE1 to UE6 will be +1, and UE11 and UE16 will be −1. The average of V then equals to the input offset, i.e., $\text{Avg}(\Sigma_{n=1}^N V(n)) = DC_{offset}$, where N is Fast Fourier Transform (FFT) point.

During the calibration procedure, sequentially each unit element is forced to output a predetermined (complementary) value, and the rest 15 elements are used to measure error of that element. One conventional method had suggested to remove one element from the DAC, which is equivalent to providing an extra DC offset at the modulator input. However, such a method is less practical, because a tri-level DAC with an extra output level of "0" has to be designed, which introduce extra analog circuitry and control logics. On the contrary, it is much easier to force DAC element generates its complementary value by setting the logic output of the DAC's latch to its opposite value. Forcing one element to output its complementary value is equivalent to providing twice of its DC offset value at the modulator input. For example, UE1 should always be +1 with a shorted input. When UE1 is forced to −1, it is equivalent to applying a DC offset of $2*DC|_{UE=-1}$ at the input, and the loop will force the rest of the DAC elements to react to this extra offset. The average value of V is then, $$V1 = \text{Avg}\left(\sum_{n=1}^{N} V(n)\right) = DC_{offset} + 2*DC|_{UE1=-1} + DE|_{UE1=-1}$$

in which $DE|_{UE=-1}$ is the dynamic errors from other switching elements. If now the confinement on UE1 is removed and UE2 is fixed to −1, the average value of V is then, $$V2 = \text{Avg}\left(\sum_{n=1}^{N} V(n)\right) = DC_{offset} + 2*DC|_{UE2=-1} + DE|_{UE2=-1}$$

The difference between UE1 and UE2 is simply half of the difference between the two averaged output digital words, if $DE|_{UE1=-1} - DE|_{UE2=-1}$ is very small compared to $2*DC|_{UE1=-1} - 2*DC|_{UE2=-1}$. The same procedure can be applied to UE 1-6 and UE 11-16 successively, and we get $$DC|_{UE_{k+1}=-1} - DC|_{UE_k=-1} = \frac{V_{k+1} - V_k}{2}, \quad k = 1 \text{ to } 5$$

$$DC|_{UE_{k+1}=-1} - DC|_{UE_k=-1} = -\frac{V_{k+1} - V_k}{2}, \quad k = 11 \text{ to } 16$$

Note only the relative error between two elements can be found. The intrinsic error for each element cannot be extracted from above technique.

Figure 6:
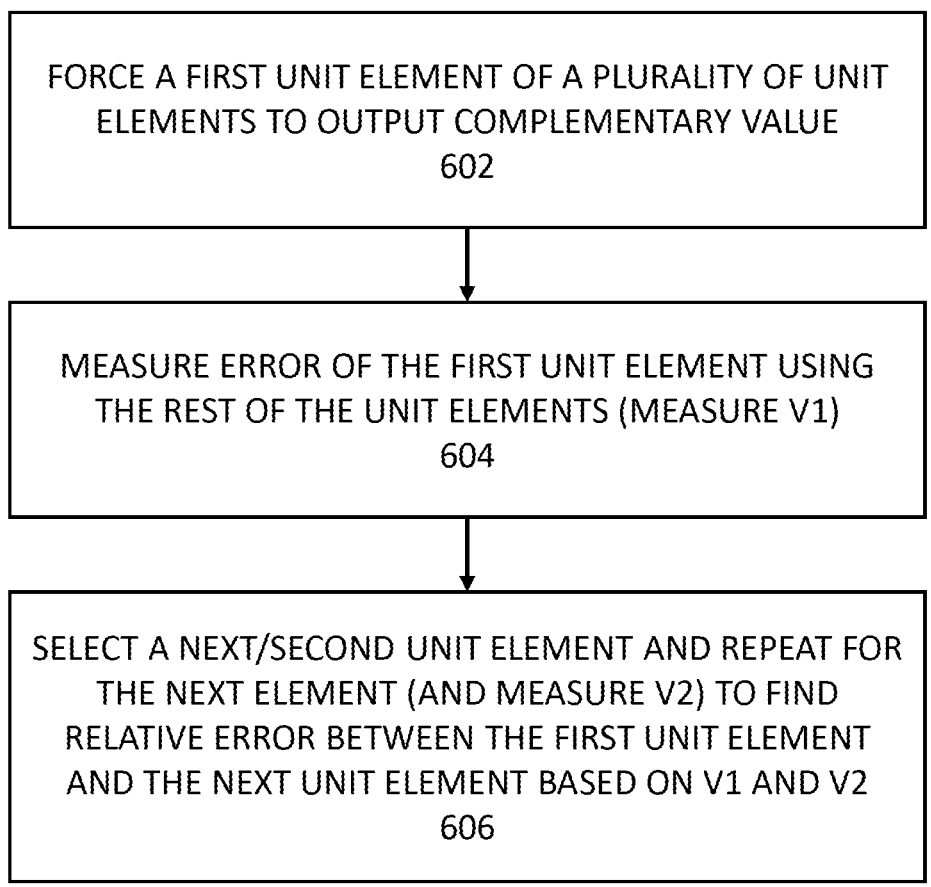
FIG. 6 shows a flow diagram of an illustrative primary method for obtaining digital-to-analog converter unit element error profile, according to some embodiments of the disclosure.

FIG. 6 shows a flow diagram of an illustrative primary method for obtaining digital-to-analog converter unit element error profile (e.g., for the non-toggling unit elements). In box 602, the method includes forcing a first UE of UEs to output complementary value (i.e., should be an opposite value of its default value, the rest of the UEs can be +1 and −1, UE2 to UE8 will be +1, and UE9 to UE16 will be −1. UE1 supposed to be +1 when shorted, now force it output −1 instead. In box 604, the method includes measuring error of the first UE using the rest of the UEs. To measure the error, the output V1 is taken (and stored). In box 606, the method includes selecting a next UE (a second UE) and repeat the error measurement step for the next UE. That is, the method includes forcing the next UE to output complementary value, and the output V2 is taken (and stored). Using V1 and V2, the relative error between the first UE and the next UE can be determined. These steps can be repeated for the rest of the UEs in an iterative fashion. That is, a further/third UE is selected and forced to output complementary value, and V3 is measured. Relative error between the second UE and the third UE can be determined from V2 and V3.

In some embodiments, a method for estimating static mismatch errors of a digital-to-analog converter (DAC) comprising of a plurality of unit elements (UEs), each unit element configured for generating currents having complementary values, and the DAC provides feedback for an analog-to-digital converter (ADC). The method can be used for determining an error profile of the feedback DAC for non-toggling elements. The errors determined using the method can be used to calibrate the unit elements.

The method first forces a first UE of the UEs to output an opposite value of a default value of the first UE. Then, the first output value of the ADC (V1) is stored while the first UE is forced to output the opposite value of the default value of the first UE. The method further includes forcing a second UE of the UEs to output an opposite value of a default value of the second UE. While the second UE is forced to output the opposite value of the default value of the second UE, a second output value of the ADC (V2) is stored. The method determines a first relative error between the first UE and the second UE based on the first output value V1 and the second output value V2.

The above described method can be applied iteratively to other non-toggling elements. For instance, the method may further include forcing a third UE of the UEs to output an opposite value of a default value of the third UE, storing a third output value of the ADC while the third UE is forced to output the opposite value of the default value of the third UE; and determining a second relative error between the second UE and the third UE based on the second output value and the third output value. These steps can be applied to fourth, fifth UEs, and so on.

Secondary Methodologies for Digital Calibration of Feedback Digital-to-Analog Converters Errors The errors for the middle elements (i.e., toggling unit elements) can be extracted differently from the primary methodology via one or more of the secondary methodologies. The statement that forcing one element to output its complementary value is equivalent to an extra DC offset at the ADC input is valid if that element generates constant output (i.e., when that element is not toggling). For example, UE1 to UE6 are always +1, and UE11-16 are always −1 with shorted input, therefore forcing UE1 to −1 is equivalent of $2*DC|_{UE=-1}$ as previously discussed. However middle elements UE7 to UE10 can toggle between +1 and −1. The error extraction method describe above in relation to FIG. 6 might not be applicable for the middle elements (i.e., the toggling unit elements).

Three different methods are described below that can accurately extract the error profile for all the DAC elements, including the middle elements (i.e., the toggling unit elements). The key point is to keep the element from switching when calibrating that element. In other words, a (normally) toggling unit element is forced to temporarily not toggle when then calibrating that unit element. One or more of the three methods can be used in combination with the primary methodology to estimate the errors of the middle elements prone to toggle (i.e., "toggling UEs").

Figure 7:
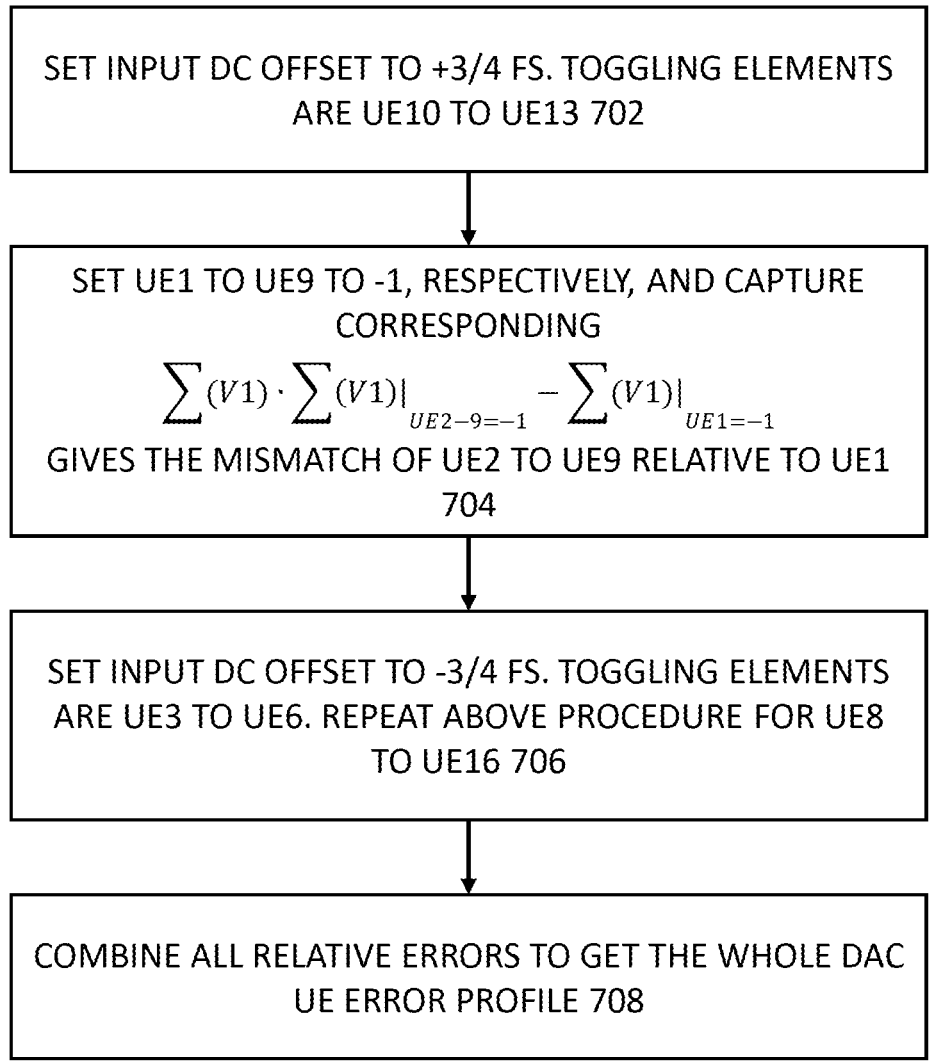
FIG. 7 shows a flow diagram of an illustrative secondary method for obtaining digital-to-analog converter unit element error profile, according to some embodiments of the disclosure.

In one exemplary secondary methodology, an external DC offset is applied at the modulator input to control which elements will toggle. One possible drawback of this method is that external DC offset has to be provided by, e.g., an extra DAC, which cost area and introduce more design complexity. FIG. 7 shows a flow diagram of this exemplary secondary methodology for obtaining digital-to-analog converter unit element error profile. Broadly speaking, the method applies external direct-current (DC) offset to the ADC, using an additional DAC, to force a first set of toggling UEs to temporarily become non-toggling UEs and a second set of non-toggling UEs to temporarily become toggling UEs. The method then determines the error profile of the temporarily non-toggling UEs while the external DC offset is applied. The boxes in FIG. 7 describes the method in further detail. In box 702, the method includes setting the input DC offset to +¾ Full Scale (FS) (a non-zero external DC offset). The (temporary) toggling elements are now UE10 to UE13 (which have been forced to toggle in response to the external DC offset of +¾ FS). In box 704, the method includes setting UE1 to UE9 to −1, respectively, and capturing corresponding output values $\Sigma(V1) \cdot \Sigma(V1)|_{UE2-9=-1} - \Sigma(V1)|_{UE1=-1}$ to obtain the mismatch of UE2 to UE9 relative to UE1. In box 706, the method includes setting input DC offset to −¾ FS. The (temporary) toggling elements are now UE3 to UE6 (which have been forced to toggle temporarily in response to the external DC offset of −¾ FS). The procedure outlined in box 704 is repeated for UE8 to UE16 (capturing corresponding output values to obtain mismatch of UE8 to UE16). In box 708, the method includes combining all relative errors to obtain the whole DAC UE error profile. The method described allows the error profile of (normally) toggling UEs to be measured.

Figure 8:
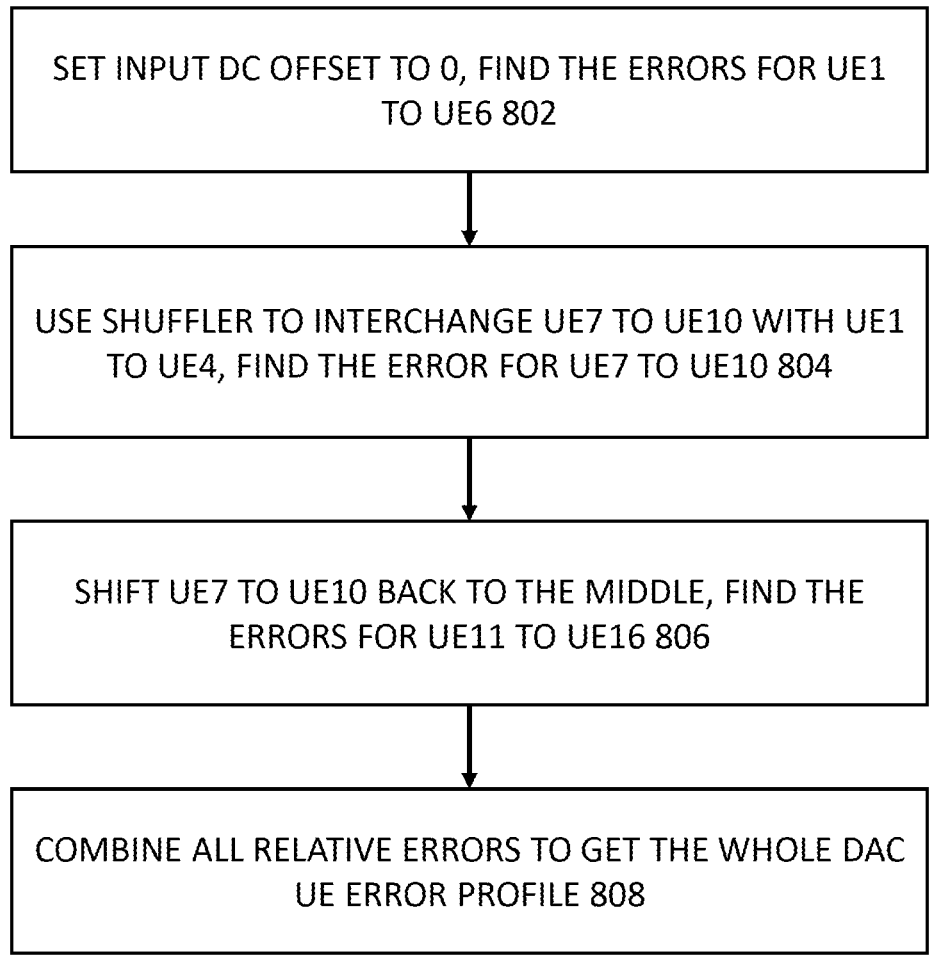
FIG. 8 shows a flow diagram of another illustrative secondary method for obtaining digital-to-analog converter unit element error profile, according to some embodiments of the disclosure.

In another exemplary secondary methodology, a shuffler is used to interchange middle elements with calibrated elements when calibrating middle elements. No external DC offset is required. One possible drawback is that a shuffler has to be made which cause extra area and power. The effect of the shuffler also provides the feature of forcing (normally) toggling UEs to temporarily become non-toggling UEs to allow the error profile of the (normally) toggling UEs to be measured. For that reason, this method of using a shuffler can be used to measure the error profile of (normally) toggling UEs. FIG. 8 shows a flow diagram of this exemplary secondary methodology for obtaining digital-to-analog converter unit element error profile. In box 802, the method includes (optionally) setting the input DC offset to 0 and finding errors for UE1 to UE6. In alternate embodiments, other suitable methodologies can be used to find the errors for UE1 to UE6. UE1 and UE6 can then be calibrated based on the errors found for UE1 to UE6. In box 804, the method applies the shuffling methodology by using the shuffler to interchange UE7 to UE10 (toggling UEs) with UE1 to UE4 (non-toggling UEs, now calibrated) and finding errors for UE7 to UE10 (now temporarily non-toggling UEs). In box 806, the method includes shifting UE7 to UE10 back to the middle and finding errors for UE11 to UE16. Any suitable methodologies, including the methodology of FIG. 6, can be used to find errors for UE11 to UE16. In box 808, the method includes combining all relative errors to obtain the whole DAC UE error profile.

In yet another exemplary secondary methodology, DC offset is applied to shift out the toggling elements when needed. However the DC offset is not provided externally, rather it is provided by already calibrated DAC elements. One important feature of this method is the use of UE1 to UE4 (once calibrated) to provide same effect as if an external DC offset had been applied. The modulator input is always shorted during calibration, and there is no extra DAC or shuffler needed. It is the most cost-effective one among all three methods. Broadly speaking, the method includes calibrating a first set of UEs based on an error profile determined for the first set of UEs to obtain a first set of calibrated UEs, wherein the first set of UEs are non-toggling UEs. Then, the first set of calibrated UEs are forced to output an opposite value of a default value of the first set of UEs to force a second set of UEs to not toggle (the second set of UEs may include (normally) toggling UEs). The error profile of the second set of UEs can then be measured while the first set of calibrated UEs are forced to output the opposite value of the default value of the first set of calibrated UEs.

Figure 9:
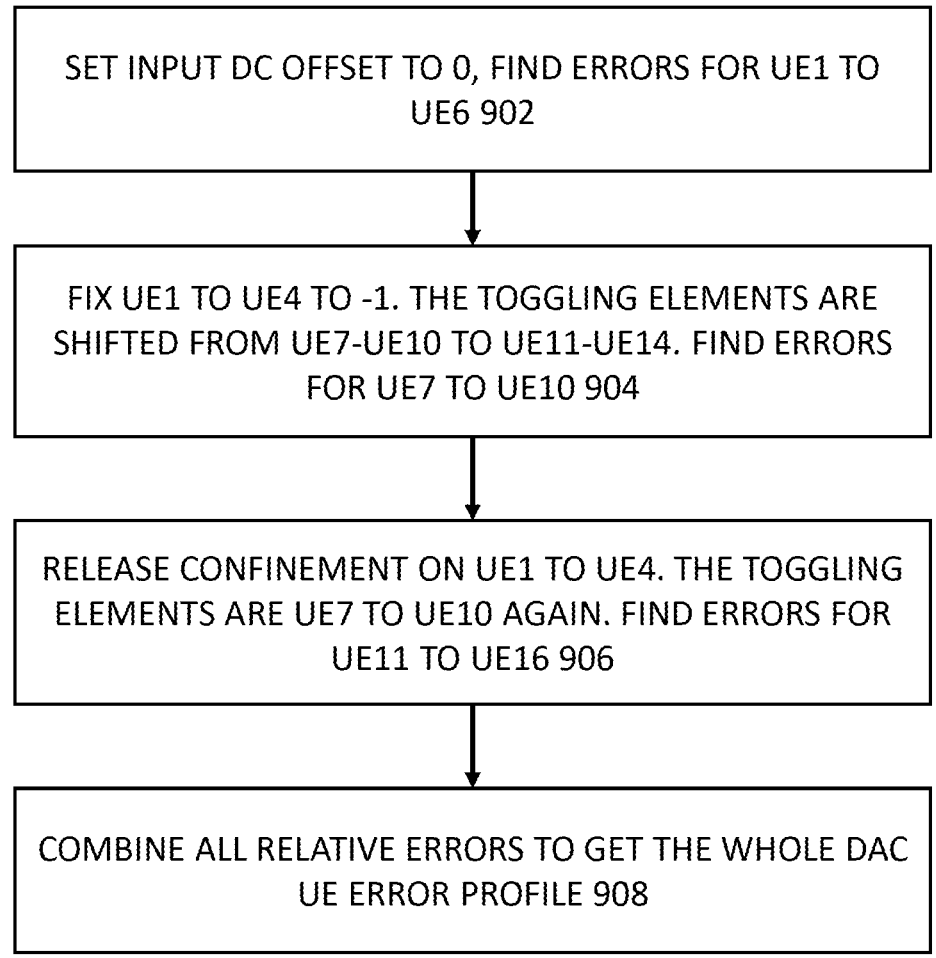
FIG. 9 shows a flow diagram of yet another illustrative secondary method for obtaining digital-to-analog converter unit element error profile, according to some embodiments of the disclosure, according to some embodiments of the disclosure.

FIG. 9 shows a flow diagram of this exemplary secondary methodology for obtaining digital-to-analog converter unit element error profile, according to some embodiments of the disclosure. In box 902, the method includes setting input DC offset to 0 and finding errors for UE1 to UE6 to calibrate UE1 to UE6. For instance, finding errors for UE1 to UE6 can include implementing the method described in relation to FIG. 6. In alternate embodiments, other suitable methodologies can be used to find the errors for UE1 to UE6. UE1 and UE6 can then be calibrated based on the errors found for UE1 to UE6. For example, measuring error profile of the first set of UEs can include fixing a particular UE in the first set of UEs to output an opposite value of a default value of the first one of the UEs, storing an output value of the ADC while the particular UE is forced to output the opposite value of the default value of the particular UE, and repeating the fixing and storing steps for other UE(s) in the first set of UEs to determine error profile of the other UE(s) in the first set of UEs. In box 904, the method includes fixing UE1 to UE4 to −1 (this provides the effect of an external DC offset). The toggling elements are shifted from UE7-UE10 to UE11-UE14 (UE11-UE14 are now temporarily toggling, UE7-UE10 are temporarily non-toggling). The method further includes finding errors for UE7 to UE10 (while UE1 to UE4 is fixed to −1). In box 906, the method includes releasing confinement on UE1 to UE4. The toggling elements are UE7 to UE10 again. The method further includes finding errors for UE11 to UE16. Any suitable methodologies, including the methodology of FIG. 6, can be used to find errors for UE11 to UE 16. In box 908, the method includes combining all relative errors to obtain the whole DAC UE error profile.

It is noted that these three method can each be used on its own for extracting the errors for all the unit elements without applying the method shown in FIG. 6. It is further noted that when the method shown in FIG. 9 is used (especially in combination with the method shown in FIG. 6), several advantages are present, because the UEs of the feedback DAC themselves are used to provide a direct-current (DC) offset equivalent to applying an external direct-current offset for determining the DAC errors. First, the feedback DAC does not require the use of tri-state UEs, which can complicate the design. Second, the method for estimating the errors would not involve removing a particular UE during the operation of the method (which can also complicate the design). Third, the error correction system can be implemented without an extra DAC for providing an external DC offset. Fourth, a shuffler is no longer required.

Error Correction System

Figure 10:
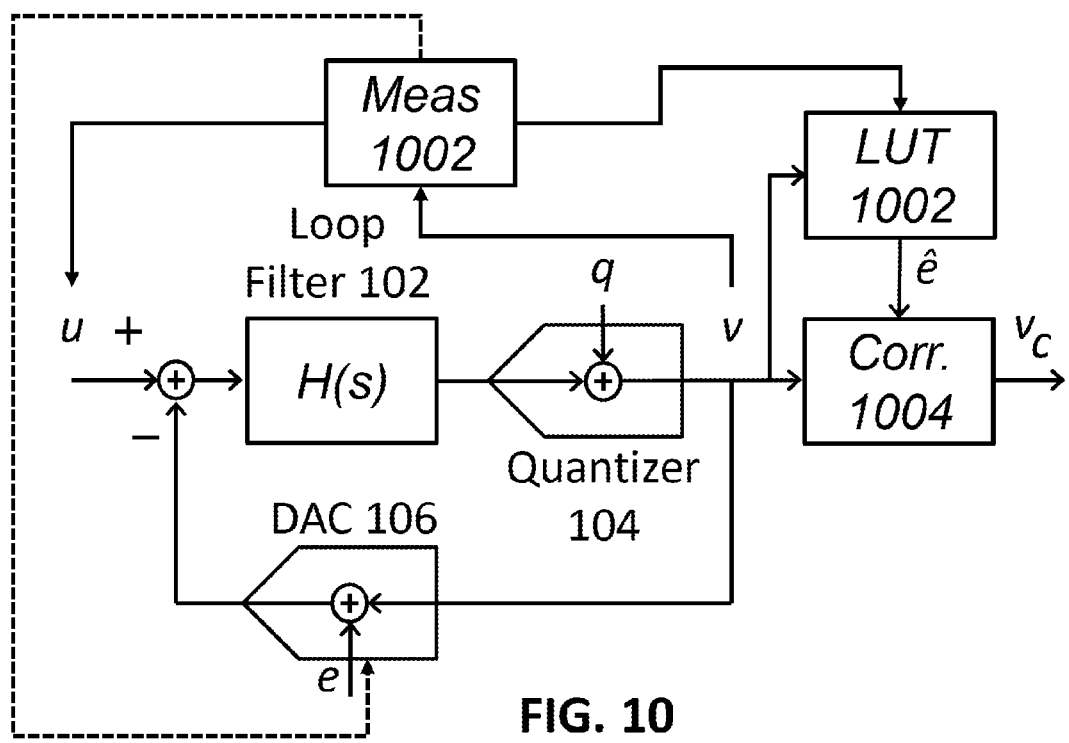
FIG. 10 is an illustrative block diagram showing a continuous-time delta-sigma modulator with error correction, according to some embodiments of the disclosure, according to some embodiments of the disclosure.

FIG. 10 is an illustrative block diagram showing a continuous-time delta-sigma modulator with error correction, according to some embodiments of the disclosure. To implement the primary and secondary methodologies described herein, a measuring module 1002, a look up table (LUT) 1002, and a correction module 1004 are added to the delta-sigma modulator as previously seen in FIG. 1. The measuring module 1004 may be configured to apply a DC offset to the input (if applicable), or fix certain unit element(s) of the DAC 106 to a particular value (if applicable). Furthermore, the measuring module 1004 may be configured to measure the output. The measuring module can be configured to apply shuffling of the UEs of the DAC 106, removing of the UEs the DAC 106, and/or finding the errors of the DAC 106 based on the methodology used. The measurements can be stored in a memory for later processing to create the error profile for all of the UEs. For instance, the error profile for all of the UEs can be stored in LUT 1002 (or some other suitable memory element). In one example, the look up table stores possible values of v with corresponding correction signals suitable for correcting an error of the feedback DAC. Based on the output, the LUT 1002 can output an error or correction signal ê suitable for correcting the feedback DAC errors (i.e., the static mismatch errors estimated by the methodologies disclosed herein. The correction module 1004 may add the correction signal to a suitable part of the signal chain (e.g., at the output of the delta-sigma modulator) to compensate for the feedback DAC errors. Other implementations for the correction module 1004 are envisioned.

Results of the Feedback DAC Error Calibration Methodologies

Figure 11:
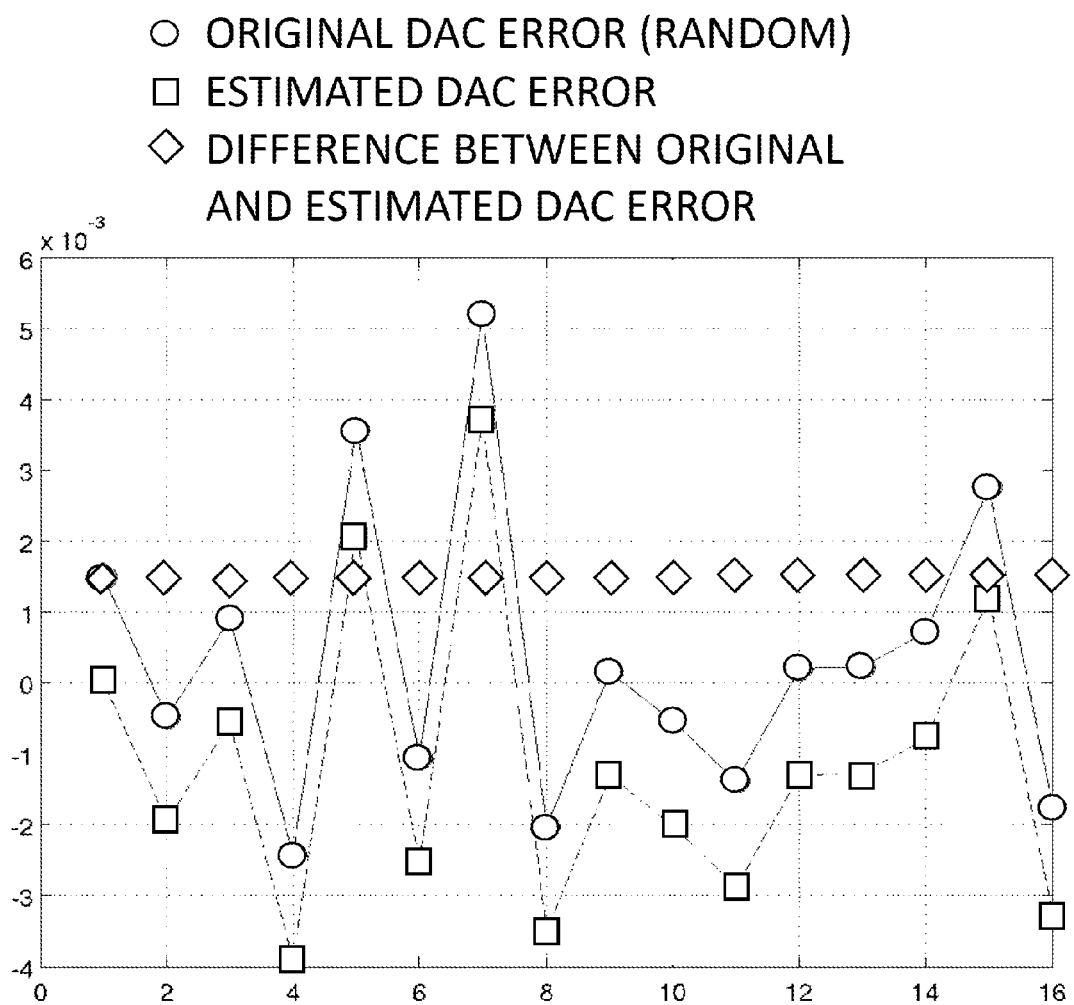
FIG. 11 shows exemplary results of the method illustrated in FIGS. 6 and 9, according to some embodiments of the disclosure, according to some embodiments of the disclosure.

Results show that the methodologies performed well in reducing static mismatch errors. The static mismatch among DAC1 elements is σ=0.2%. The rest of the ADC is ideal. To get the statistical distribution of corrected performance, 30 trials were run within each run and DAC1 element mismatch are randomly generated. Results using the method shown in FIGS. 6 and 9 are shown (results, although not shown, using the method shown in FIGS. 9 and 10 are similar) in FIG. 11, according to some embodiments of the disclosure, based on the 1-2 MASH CT ADC shown in FIG. 2. Specifically, FIG. 11 shows the estimated DAC1 error profile compared with its original error profile. The errors of DAC1 elements can be accurately extracted, with a steady offset to its original errors. The offset will only cause a DAC gain error, and will not affect the performance too much.

Figure 12:
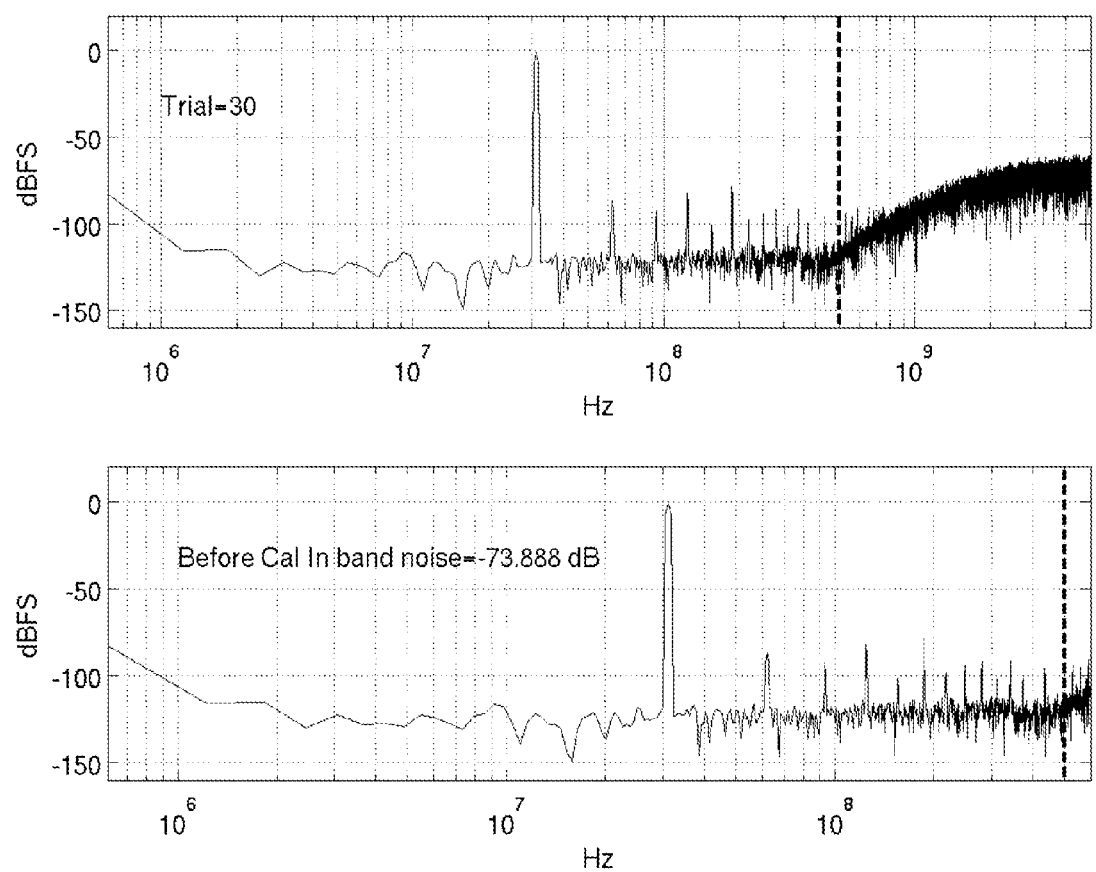
FIG. 12 shows exemplary power spectrum and exemplary integrated in band noise plot prior to calibration.
Figure 13:
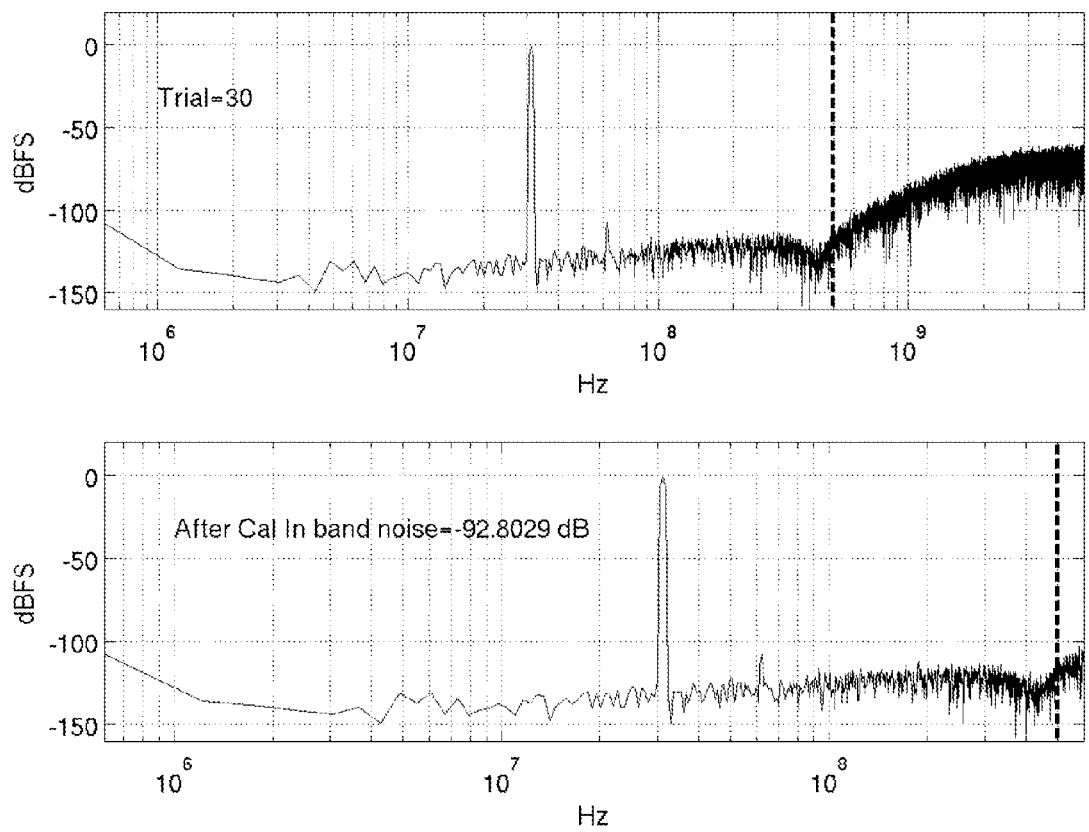
FIG. 13 shows exemplary power spectrum and exemplary integrated in band noise plot after calibration using the method illustrated in FIGS. 6 and 9, according to some embodiments of the disclosure.

FIG. 12 shows exemplary power spectrum and exemplary integrated in band (IBN) noise plot prior to calibration. FIG. 13 shows exemplary power spectrum and exemplary integrated in band noise (IBN) plot after calibration using the method illustrated in FIGS. 6 and 9, according to some embodiments of the disclosure. The test signal was a 0 dBFS, 30 MHz sine wave. Before calibration, multiple harmonic distortions are observed and the IBN is degraded to −73.8 dB (as seen in FIG. 12). After calibration, the ideal performance is almost restored (as seen in FIG. 13). There is a small HD2 left, but is below −100 dB. The IBN is reduced by almost 20 dB.

Figure 14:
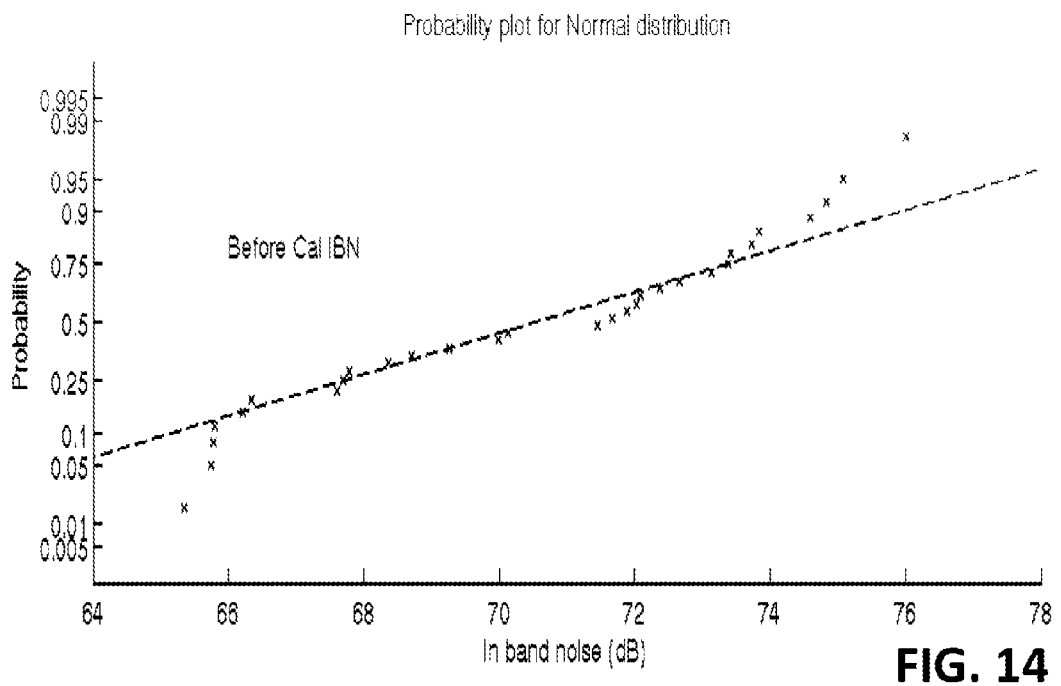
FIG. 14 shows an exemplary probability plot of in band noise prior to calibration.
Figure 15:
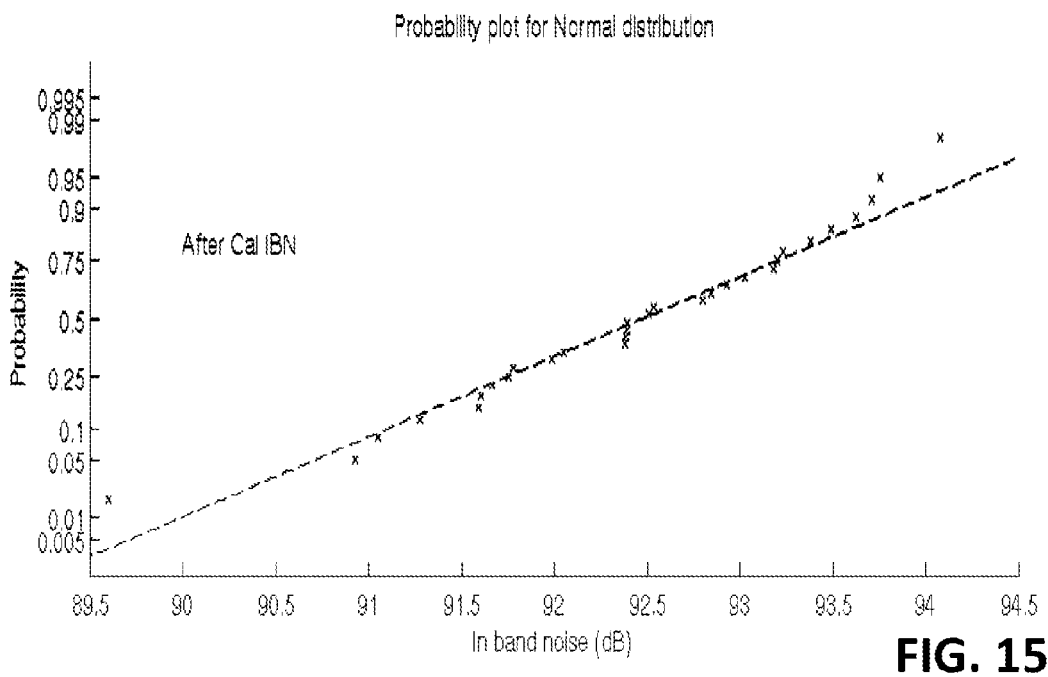
FIG. 15 shows an exemplary probability plot of in band noise after calibration using the method illustrated in FIGS. 6 and 9, according to some embodiments of the disclosure.

FIG. 14 shows an exemplary probability plot of in band noise (IBN) prior to calibration. FIG. 15 shows an exemplary probability plot of in band noise (IBN) after calibration using the method illustrated in FIGS. 6 and 9, according to some embodiments of the disclosure. As seen in the two FIGURES, The 90-percentile IBN value is improved from −65 dB to −90 dB.

The following table summarizes the simulation results in terms of median and 90-percentile of IBN, HD2 and HD3 applying the method shown in FIG. 7, FIG. 8, and FIG. 9. All three methods effectively find the static error profile. The 90-percentile (p90) IBN value all are improved to below −90 dB level. Both HD2 [second harmonic distortion] and HD3 [third harmonic distortion] are suppressed below −95 dB after calibration.

|  | BEFORE CALIBRATION (MEDIAN/P90) | METHOD OF FIG. 7 (MEDIAN/P90) | METHOD OF FIG. 8 (MEDIAN/P90) | METHOD OF FIG. 9 (MEDIAN/P90) |
|---|---|---|---|---|
| IBN (dBFS) | −71/−65 | −92/−90 | −92/−91 | −92/−90 |
| HD2 (dBFS) | −75/−68 | −103/−97 | −105/−98 | −106/−98 |
| HD3 (dBFS) | −82/−70 | −116/−111 | −112/−106 | −113/106 |

Variations, Implementations, and Exemplary Applications

The calibration method works well for the DACs in single loop delta-sigma ADC and MASH DS ADCs. However the same procedure can be applied to calibrate DACs in successive-approximation-register or pipeline ADC. As long as there is a coarse ADC available, the coarse ADC and the DAC can be used together in a feedback loop configuration as a delta-sigma ADC, where the methods disclosed herein can be applied.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or summary of features. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or summary of features. The description and drawings are, accordingly, to be regarded in an illustrative rather than in a restrictive sense.

Note that the activities discussed above with reference to the FIGS. 6-9 are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. For instance, the features disclosed herein may be particularly useful for base stations in cellular communications, where networks and standards such as Long Term Evolution (LTE) have continued to increase the need for high speed ADCs with high precision.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIG. 10 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to digital error calibration, such as ones shown in FIGS. 6-10, illustrate only some of the possible functions that may be executed by, or within, systems illustrated in FIG. 10. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or summary of features. In order to assist the United States Patent and Trademark Office (USPTO) and, additionally, any readers of any patent issued on this application in interpreting the claims (if any) or summary of features appended hereto, Applicant wishes to note that the Applicant: (a) does not intend any of the appended claims (if any) or summary of features to invoke paragraph six (6) of 35 U.S.C. section 112 as it exists on the date of the filing hereof unless the words "means for" or "step for" are specifically used in the particular claims (if any) or summary of features; and (b) does not intend, by any statement in the specification, to limit this disclosure in any way that is not otherwise reflected in the appended claims (if any) or summary of features.

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

SUMMARY OF FEATURES

Example 1 includes a method for estimating static mismatch errors of a digital-to-analog converter (DAC) comprising of a plurality of unit elements (UEs), each unit element configured for generating currents having complementary values (equivalent or normalized to +1 or −1). The DAC is configured in a feedback configuration with a (coarse) analog-to-digital converter. The method includes the method illustrated in FIG. 6 (for the non-toggling UEs).

In Example 2, the subject matter of Example 1 can optionally include the method illustrated in FIG. 7 (for the toggling UEs).

In Example 3, the subject matter of Example 1 or 2 can optionally include the method illustrated in FIG. 8 (for the toggling UEs).

In Example 4, the subject matter of any one of Examples 1-3 can optionally include the method illustrated in FIG. 9 (for the toggling UEs).

In Example 5, the subject matter of any one of Examples 1-4 can optionally include: not having tri-state unit elements or removal of a particular unit element during the operation of the method.

In Example 6, the subject matter of any one of Examples 1-5 can optionally include: unit elements comprising complementary digital-to-analog converters.

In Example 7, the subject matter of any one of Examples 1-6 can optionally include using the unit elements themselves to provide a direct-current (DC) offset for estimating the DAC errors (avoiding to always apply a direct-current (DC) offset at the input of the DAC or require external circuitry such as an extra DAC).

Example 7 includes a method for estimating static mismatch errors of a digital-to-analog converter (DAC) comprising of a plurality of unit elements (UEs), each unit element configured for generating currents having complementary values (equivalent or normalized to +1 or −1). The DAC is configured in a feedback configuration with a (coarse) analog-to-digital converter. The method includes the method illustrated in FIG. 9 (for both toggling and non-toggling UEs).

Example 8 is a system, such as the one shown in FIG. 10, for implementing any one of the methods in the above examples.

All of the above examples are applicable in one or more of the following: CTDSM MASH structure, CTDSM single loop structure, pipeline ADC structure, SAR ADC structure, CT-pipeline ADC structure, or any structure with a (coarse) ADC and a feedback DAC.

What is claimed is:

1. A method for estimating static mismatch errors of a digital-to-analog converter (DAC) comprising of a plurality of unit elements (UEs), each unit element configured for generating currents having complementary values, and the DAC provides feedback for an analog-to-digital converter (ADC), the method comprises:
   forcing a first UE of the UEs to output an opposite value of a default value of the first UE;
   storing a first output value of the ADC while the first UE is forced to output the opposite value of the default value of the first UE;
   forcing a second UE of the UEs to output an opposite value of a default value of the second UE;
   storing a second output value of the ADC while the second UE is forced to output the opposite value of the default value of the second UE; and
   determining a first relative error between the first UE and the second UE based on the first output value and the second output value.

2. The method of claim 1, further comprising:
   forcing a third UE of the UEs to output an opposite value of a default value of the third UE;
   storing a third output value of the ADC while the third UE is forced to output the opposite value of the default value of the third UE; and
   determining a second relative error between the second UE and the third UE based on the second output value and the third output value.

3. The method of claim 1, wherein the first UE and the second UE are non-toggling UEs.

4. The method of claim 1, further comprising:
   applying external direct-current (DC) offset to the ADC, using an additional DAC, to force a first set of toggling UEs to temporarily become non-toggling UEs and a second set of non-toggling UEs to temporarily become toggling UEs; and
   determine error profile of the temporarily non-toggling UEs while the external DC offset is applied.

5. The method of claim 4, wherein the external direct-current (DC) offset is non-zero.

6. The method of claim 1, further comprising:
   interchanging, using a shuffler, toggling UE(s) with non-toggling UEs to determine error profile of the toggling UE(s).

7. The method of claim 1, further comprising:
   calibrating a first set of UEs based on an error profile determined for the first set of UEs to obtain a first set of calibrated UEs, wherein the first set of UEs are non-toggling UEs;
   forcing the first set of calibrated UEs to output an opposite value of a default value of the first set of UEs to force a second set of UEs to not toggle; and measuring error profile of the second set of UEs while the first set of calibrated UEs are forced to output the opposite value of the default value of the first set of calibrated UEs.

8. The method of claim 1, wherein:
calibrating a first set of UEs comprises:
fixing a particular UE in the first set of UEs to output an opposite value of a default value of the first one of the UEs;
storing an output value of the ADC while the particular UE is forced to output the opposite value of the default value of the particular UE; and
repeating the fixing and storing steps for other UE(s) in the first set of UEs to determine error profile of the other UE(s) in the first set of UEs.

9. The method of claim 1, wherein the feedback DAC does not have tri-state UEs, or the method does not involve removal of a particular UE during the operation of the method.

10. The method of claim 1, wherein the UEs comprises complementary digital-to-analog converters.

11. The method of claim 1, further comprising:
using the UEs themselves to provide a direct-current (DC) offset equivalent to applying an external direct-current offset for determining the DAC errors.

12. The method of claim 1, wherein:
the feedback DAC processes an output of the ADC and provides an output being provided in an input path to the ADC; and
an average of the output of the ADC is forced to equal to the input to the ADC.

13. The method of claim 1, wherein unit elements comprises cells for generating parts of an analog output of the DAC.

14. A method for estimating static mismatch errors of a digital-to-analog converter (DAC) comprising of a plurality of unit elements (UEs), each unit element configured for generating currents having complementary values, and the DAC being in a feedback configuration with an analog-to-digital converter (ADC), the method comprises:
measuring error profile of the first set of UEs;
calibrating the first set of UEs based on an error profile of the first set of UEs to obtain a first set of calibrated UEs, wherein the first set of UEs are non-toggling UEs;
forcing the first set of calibrated UEs to output an opposite value of a default value of the first set of UEs to force a second set of UEs to temporarily not toggle; and
measuring error profile of the second set of UEs.

15. The method of claim 14, wherein measuring error profile of the first set of UEs comprises:
fixing a particular UE in the first set of UEs to output an opposite value of a default value of the first one of the UEs;
storing an output value of the ADC while the particular UE is forced to output the opposite value of the default value of the particular UE; and
repeating the fixing and storing for other UE(s) in the first set of UEs to determine error profile of the other UE(s) in the first set of UEs.

16. A system for measuring for estimating static mismatch errors of a digital-to-analog converter (DAC) comprising of a plurality of unit elements (UEs), each unit element configured for generating currents having complementary values, and the DAC being in a feedback configuration with an analog-to-digital converter (ADC), the system comprises:
a measuring module configured to measure error profile of the DAC by:
forcing a first UE of the UEs to output an opposite value of a default value of the first UE;
storing a first output value of the ADC while the first UE is forced to output the opposite value of the default value of the first UE;
forcing a second UE of the UEs to output an opposite value of a default value of the second UE;
storing a second output value of the ADC while the second UE is forced to output the opposite value of the default value of the second UE; and
determining a relative error between the first UE and the second UE based on the first output value and the second output value; and
a look up table for storing possible values of the output of the ADC with corresponding correction signals suitable for correcting error profile of the feedback DAC determined by the measuring module.

17. The system of claim 16, wherein the measuring module is further configured to measure the error profile by:
measuring error profile of the first set of UEs;
calibrating the first set of UEs based on an error profile of the first set of UEs to obtain a first set of calibrated UEs, wherein the first set of UEs are non-toggling UEs;
forcing the first set of calibrated UEs to output an opposite value of a default value of the first set of UEs to force a second set of UEs to temporarily not toggle; and
measuring error profile of the second set of UEs.

18. The system of claim 16, further comprising:
a correction module for adding a correction signal from the look up table to the ADC to compensate for the feedback DAC errors.

19. A system for improving linearity, the system comprising:
a digital-to-analog converter (DAC) in a feedback configuration with an analog-to-digital converter (ADC), said DAC comprising a plurality of cells for generating currents having complementary values; and
a measurement module for measuring an error profile of the DAC:
iteratively setting logic output(s) of different cell(s) of the DAC to latch to an opposite value of the default value of the one or more selected cells, and iteratively storing outputs of the ADC; and
determining relative errors of the plurality of cells of the DAC based on stored outputs of the ADC.

20. The system of claim 19, wherein iteratively setting logic output of the different cells iteratively provides twice of the different cells' DC offset value at an input of a loop formed by the feedback configuration.

21. The system of claim 19, wherein determining relative errors of cells of the DAC comprises measuring a difference between two cells using the rest of the cells of the DAC.

22. The system of claim 19, wherein iteratively setting logic output(s) and iteratively storing outputs comprises:
forcing a first cell of the cells to output an opposite value of a default value of the first cell;
storing a first output value of the ADC while the first cell is forced to output the opposite value of the default value of the first cell;
forcing a second cell of the cells to output an opposite value of a default value of the second cell;
storing a second output value of the ADC while the second cell is forced to output the opposite value of the default value of the second cell; and
determining relative errors comprises determining a relative error between the first cell and the second cell based on the first output value and the second output value.

23. The system of claim 19, wherein iteratively setting logic output(s) and iteratively storing outputs comprises:
- setting logic outputs of a first set of calibrated cells to output an opposite value of a default value of the first set of cells to force a second set of cells to temporarily not toggle; and
- iteratively setting logic outputs of the second set of cells one by one to latch to an opposite value of the default value, and iteratively storing outputs of the ADC for measuring an error profile of the second set of cells.

24. The system of claim 19, wherein:
- the DAC in the feedback configuration with the ADC processes an output of the ADC and provides an output being provided in an input path to the ADC; and
- an average of the output of the ADC is forced to equal to the input to the ADC.

25. The system of claim 19 is part of one or more of the following: a continuous time delta sigma multi-stage noise shaping ADC, a continuous time delta sigma modulator, a pipeline ADC, a successive-approximation register ADC, or a continuous time pipeline ADC.

* * * * *